United States Patent
Shi et al.

(10) Patent No.: US 6,794,761 B2
(45) Date of Patent: Sep. 21, 2004

(54) NO-FLOW UNDERFILL MATERIAL

(75) Inventors: Song-Hua Shi, Phoenix, AZ (US); Tian-An Chen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/844,855

(22) Filed: Apr. 26, 2001

(65) Prior Publication Data

US 2002/0190370 A1 Dec. 19, 2002

(51) Int. Cl.[7] .............................................. H01L 23/48
(52) U.S. Cl. ...................................... 257/787; 257/678
(58) Field of Search ................................ 257/787, 678; 528/94; 523/457

(56) References Cited

U.S. PATENT DOCUMENTS 5,026,816 A * 6/1991 Keehan ..................... 528/94
6,180,696 B1 * 1/2001 Wong et al. ............... 523/457

FOREIGN PATENT DOCUMENTS

JP 61112086 A * 5/1986 ............... 428/392

* cited by examiner

Primary Examiner—Ori Nadau
Assistant Examiner—Douglas W. Owens
(74) Attorney, Agent, or Firm—Blakely, Sokoloff, Taylor & Zafman LLP

(57) ABSTRACT

A siloxirane based no-flow underfill material is provided. The material has a low coefficient of thermal expansion, low moisture uptake and a high distortion temperature. The material typically includes at least an epoxy siloxiane resin, a cross-linking hardener, a catalyst, and a fluxing agent.

28 Claims, 1 Drawing Sheet

NO-FLOW UNDERFILL MATERIAL

BACKGROUND OF THE INVENTION

1). Field of the Invention

This invention relates to a no-flow underfill material.

2). Discussion of Related Art

A semiconductor package may be constructed from a package substrate having bond pads thereon and an integrated circuit die having bumps formed thereon. A fluxing agent is usually deposited over the package substrate and the bond pads and the bumps are then brought into contact with the bond pads. Subsequent heating in a reflow oven attaches the bumps to the bond pads. The fluxing agent removes oxides from surfaces of the bond pads and bumps to ensure a reliable joint between the bumps and the bond pads.

The fluxing agent is subsequently washed out in a defluxing machine. An underfill material is then dispensed next to the die on the substrate utilizing a dispensing machine. The underfill material then flows under capillary action into and fills a gap between the die and the substrate, with or without the help of heating. The underfill material serves to redistribute stresses on the bumps due to a mismatch in a coefficient of thermal expansion (CTE) of the substrate and a CTE of the die when the package is heated or cooled.

A so-called no-flow underfill material may be used instead of a conventional fluxing agent to eliminate the need for a defluxing machine and other machinery, and to significantly reduce throughput time. A no-flow underfill material is applied like a conventional fluxing agent and to an extent serves the purpose of a conventional fluxing agent. The no-flow underfill material cures while the package is transferred through a reflow oven, and, to an extent, can then serve the additional purpose of a conventional underfill material. Post cure of the material may be needed.

Existing no-flow underfill materials have been shown to be unsatisfactory because of one or more reasons such as a very high CTE, high moisture absorption, etc.

BRIEF DESCRIPTION OF THE DRAWINGS

The invention is further described by way of example with reference to the accompanying drawings wherein.

DETAILED DESCRIPTION OF THE INVENTION

Figure 1:
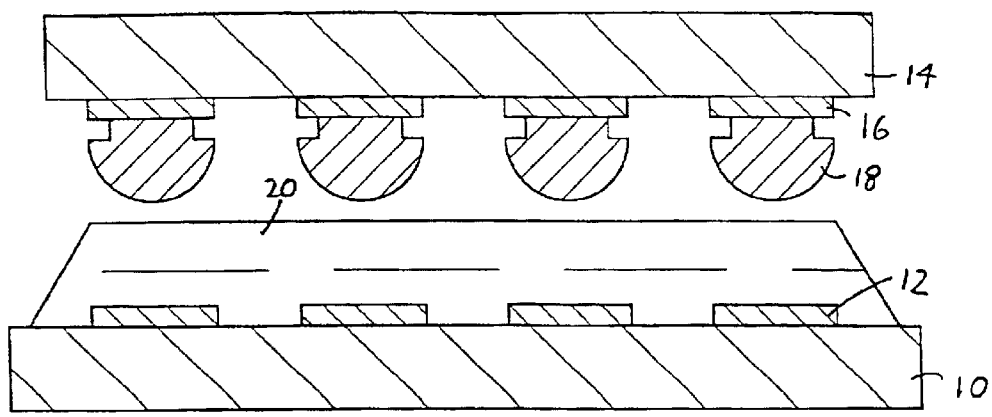
FIG. 1 is a cross-sectional side view illustrating a partially assembled semiconductor package utilizing a no-flow underfill material.

A no-flow underfill material is provided that includes at least:

(i) an epoxy Siloxirane™ resin;
(ii) at least one agent acting as a cross-linking hardener capable of curing an epoxy resin and a curing catalyst capable of catalyzing the curing of the epoxy resin; and
(iii) a compatible fluxing agent.

The Siloxirane™ resin may in its pre-cure monomer state be represented by:

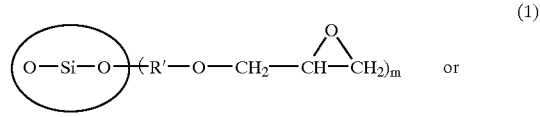

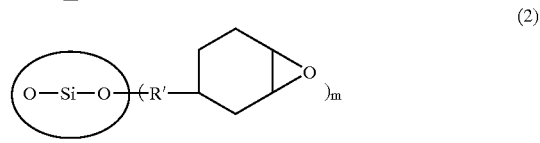

where m is the number of reactive oxirane groups on the surface of the O—Si—O domain and m ranges from 1 to 30. R' is selected from the group consisting of phenylene, bisphenylene, carbonyl, and alkylene. The alkylene herein refers to a branched or unbranched saturated hydrocarbon group of 1 to 24 carbon atoms, such as methylene ("Me"), ethylene ("Et"), n-propylene, isopropylene, n-butylene, isobutylene, t-butylene, octylene, decylene, and the like. Preferred alkylene groups herein contain from 1 to 12 carbon atoms. An organic moiety may be used in the monomer in eq. 1 to link the $SiO_2$ group with the oxirane group.

The $SiO_2$ group (O—Si—O) in eq. 1 or 2 can be a surface-grafted fused silica particle with a size less than 50 micron. Alternatively, the $SiO_2$ group can be a cyclic $SiO_2$ domain.

The $SiO_2$ group has a low CTE, low moisture uptake, and a high distortion temperature. A cyclic $SiO_2$ group also provides polymer flexibility and a correspondingly higher toughness.

The oxirane group $CH_2CHCH_2O$ in eq. 1 is a diglycidyl ether type oxirane group and the oxirane group in eq. 2 is a cycloaliphatic oxirane group. The oxirane group in eq. 1 or eq. 2 provides cross-linking of the monomer with good adhesion to different surfaces. Cross-linking density of an eventual polymer can be controlled by the number of oxirane groups on each $SiO_2$ group.

The agent acting as a cross-linking hardener and a catalyst may be a single material such as an imidazole or its derivative, triphenylphosphine, or an onium salt. The agent may include a separate hardener and catalyst. The hardener may for example be an amine, an anhydride, a poly amide, a polyamide amine, or a phenolic resin, and the catalyst may be an imidazolium salt, or a tertiary amine. The agent, during curing, creates a polymerized polymer out of the monomer with a three-dimensional cross-linked structure. The ratio at which the imidazole or its derivatives, or tripheylphosphine, or onium salt that is added in the formulation ranges from 0.01 wt % to 20 wt % of the weight of the Siloxirane™ resin. The ratio at which amine, or polyamide, or polyamide amine that is added in the formulation is 1 reactive amine hydrogen equivalent to 0.1 to 10 epoxide equivalent of the Siloxirane™ resin. The ratio at which anhydride that is added in the formulation is 1 anhydride ring equivalent to 0.1 to 10 epoxide equivalent weight of the Siloxirane™ resin.

The fluxing agent can be any acid which can be dissolved in the Siloxirane™ resin and the agent. The fluxing agent is preferably an organic carboxylic acid, or a polymeric fluxing agent, or an organic compound that contains one or more hydroxyl groups. The fluxing agent may for example be a glutaric acid or a trifluro acetic acid. The ratio at which a fluxing agent that is added in the formulation ranges from 0.1 wt % to 20 wt % of the weight of the Siloxirane™ resin.

The material preferably further includes an adhesion promoter to further increase the adhesion strength between underfill material and all contact surfaces. The adhesion promoter may for example be a silane coupling agent, an organo-ziconate, or an organo-titanate. The ratio at which an adhesion promoter is added in the formulation ranges from 0.01 wt % to 10 wt % of the weight of the Siloxirane™ resin.

The material preferably further includes a non-ionic surfactant to help material flow and eliminate process voids. The surfactant may be a polyol, a siloxane compound, or a fluorinated compound such as FC-430 from 3M Corporation of St. Paul, Minn. The ratio at which an adhesion promoter is added in the formulation ranges from 0.01 wt % to 10 wt % of the weight of the Siloxirane™ resin.

The material preferably further includes a de-foaming agent which prevents air entry and bubble formation during processing. The de-foaming agent may for example be BYK-066 from BYK-chemie of Wesel in Germany. The ratio at which a de-foaming agent is added in the formulation ranges from 0.01 wt % to 10 wt % of the weight of the Siloxirane™ resin.

The material preferably further includes fused silica to further reduce CTE and moisture uptake, and increase modulus. The ratio at which a fused silica is added in the formulation ranges from 1 wt % to 300 wt % of the weight of the Siloxirane™ resin.

The material preferably further includes silver flakes to provide electrical conductivity. The ratio at which a silver flake is added in the formulation ranges from 10 wt % to 500 wt % of the weight of the Siloxirane™ resin.

The material preferably further includes thermally conductive particles to provide desired thermal conductivity. The thermally conductive particles may for example be silicon nitride, silicon borate, alumina, diamond, or silicon oxide. The ratio at which a thermally conductive particle is added in the formulation ranges from 10 wt % to 500 wt % of the weight of the Siloxirane™ resin.

Example 1

| | |
|---|---|
| a. Siloxirane ™ resin (eq. 1 or 2): | 100 part (by weight) |
| b. 2-ethyl-4-methyl imidazole acting as both hardener and catalyst: | 4 parts |
| c. Glutaric acid as a fluxing agent: | 4.0 part |
| d. FC-430 as a surfactant: | 0.2 part |
| e. BYK-066 (defoaming agent): | 0.05 part |
| f. 3-glycidoxy propyl methyl diisopropenoxy silane (adhesion promoter) | 0.2 part |
| g. fused silica filler | 40 parts |

Example 2

| | |
|---|---|
| a. Siloxirane ™ resin (eq. 1 or 2): | 100 part (by weight) |
| b. methyl hexahydrophthalic anhydride acting as a hardener: | 100 parts |
| c. triphenyiphospine acting as a catalyst: | 0.8 parts |
| d. Glutaric acid as a fluxing agent: | 8.0 parts |
| e. glycerol (assisting fluxing agent) | 8.0 parts |
| f. polyoxyethylene (surfactant): | 0.4 part |
| g. BYK-066: | 0.1 part |
| h. neopentyl (diallyl)oxy tri(N-ethylenediamineo) ethyl titanate (adhesion promoter) | 0.6 part |
| i. silicon nitride (thermally conductive particles) | 100 parts |

Example 3

| | |
|---|---|
| a. Siloxirane ™ resin (eq. 1 or 2): | 100 part (by weight) |
| b. 2-phenyl-4,5-dihydroxymethylimidazole: | 6 parts |
| c. trifluoro acetic acid as a fluxing agent: | 4.0 part |
| d. silicone as a surfactant: | 0.4 part |
| e. BYK-066: | 0.05 part |
| f. neopentyl(diallyl)oxy tri(dioctyl) pyrophosphato zirconate (adhesion promoter) | 0.3 part |
| g. silver flakes (electrically conductive filler) | 300 parts |

Figure 2:
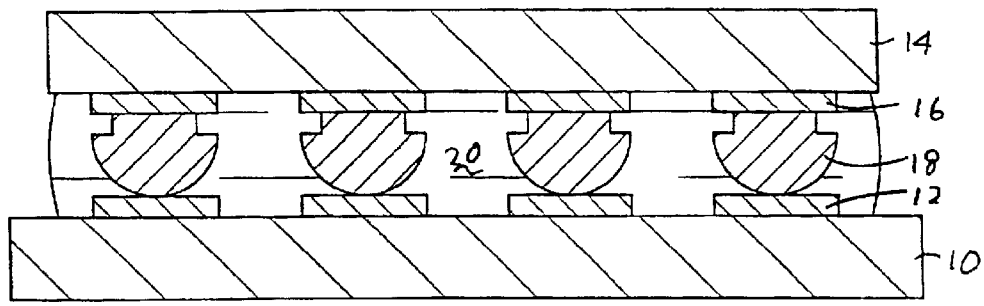
FIG. 2 is a view similar to FIG. 1 after bumps formed on a die are located in the no-flow underfill material and in contact with bond pads on a substrate.
Figure 3:
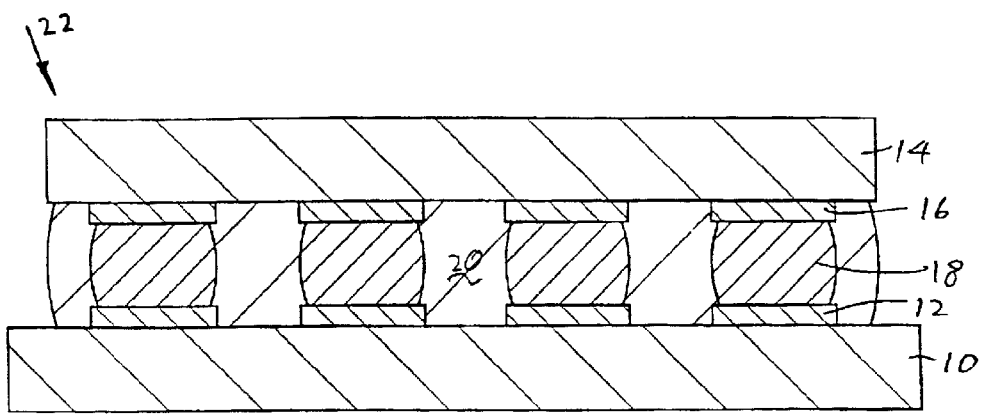
FIG. 3 is a view similar to FIG. 2 after solder reflow.

FIGS. 1 to 3 illustrate how the no-flow underfill material is used in the construction of a semiconductor package. FIG. 1 illustrates an initial stage in the assembly of the semiconductor package. The semiconductor package includes a package substrate 10, bond pads 12, a semiconductor die 14, contact pads 16, bumps 18, and the no-flow underfill material 20. The bond pads 12 are formed on an upper surface of the package substrate 12. The contact pads 16 are formed on, as shown in FIG. 1, a lower surface of the die 14 and the bumps 18 are formed on the contact pads 16 according to the well known controlled collapse chip connect (C4) process. The no-flow underfill material 20 is deposited over the upper surface of the substrate 10 and covers all previously exposed surfaces of the bond pads 12.

As shown in FIG. 2, the bumps 18 are then inserted into the no-flow underfill material 20 until each bump 18 contacts a respective bond pad 12. The no-flow underfill material 20 then fills regions between the bumps 18.

The assembly of FIG. 2 is then passed through a reflow oven or thermal compressive bonder to form a final assembly as shown in FIG. 3 of a semiconductor package 22 according to an embodiment of the invention. The bumps 18 reflow at a temperature higher than their melting point so that they reflow over the bond pads 12. The material 20 serves to remove oxygen from the bumps 18 and the bond pads 12. The removal of oxygen facilitates the formation of a more reliable electrical joint between each bump 18 and its respective bond pad 12.

The temperature to which the assembly in FIG. 2 is cycled is also sufficiently high to cause cross-linking of oxirane groups to form a very strong polymer. The material 20 thus solidifies, as is required for purposes of distributing stresses which tend to shear the bumps 18 from the bond pads 12 and the contact pads 16.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A no-flow underfill material comprising:

an epoxy-based resin represented by:

$$R1—R3—R2$$

where R1 includes SiO$_2$;
R2 is a reactive organic functional group selected from the group consisting of an isocynate group and a carbonyl chloride group;
R3 is an organic chain segment;
at least one agent acting as a cross-linking hardener and a curing catalyst capable of catalyzing the curing of the epoxy-based resin; and
a fluxing agent.

2. The material of claim 1 wherein R1 is a surface-grafted fused silica particle with a size less than 50 microns.

3. The material of claim 2 wherein a structure of R1 is made cyclic.

4. The material of claim 1 wherein R1 includes an oxygen atom linked to the silica particle, R3 being linked to the oxygen atom.

5. The material of claim 1 wherein R2 includes an oxirane group represented by:

6. The material of claim 5 wherein R2 is represented by:

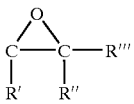

wherein R', R", and R'" are hydrogen or alkyl groups.

7. The material of claim 6 wherein R2 is represented by:

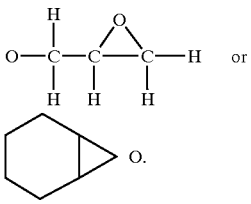

8. The material of claim 1 wherein the agent acting as a cross-linking hardener and a catalyst includes both a hardener and a catalyst.

9. The material of claim 1 wherein the cross-linking hardener is selected from the group consisting of an imidazole and its derivatives, an amine, a triphenylphosphine, an anhydride, a polyamide, a polyamide amine, a phenolic resin, and an onium salt.

10. The material of claim 1 wherein the catalyst is selected from the group consisting of an imidazole and its derivatives, an imidazolium salt, a triphenylphosphine, a tertiary amine, and an onium salt.

11. The material of claim 1 wherein the fluxing agent is dissolved in a mixture of the epoxy-based resin and the agent acting as a cross-linking hardener.

12. The material of claim 1 wherein the fluxing agent is selected from the group consisting of an organic carboxylic acid, a polymeric fluxing agent, and an organic compound that contains one or more hydroxyl groups.

13. The material of claim 1 further comprising:
an adhesion promoter.

14. The material of claim 13 wherein the adhesion promoter is selected from the group consisting of a silane coupling agent, an organo-ziconate, and an organo-titanate.

15. The material of claim 1 further comprising:
a non-iomic surfactant.

16. The material of claim 15 wherein the surfactant is selected from the group consisting of polyol, a siloxane compound, and a fluorinated compound.

17. The material of claim 1 further comprising:
fused silica.

18. The material of claim 1 further comprising:
silver flakes.

19. The material of claim 1 further comprising:
thermally conductive particles.

20. The material of claim 19 wherein the thermally conductive particles include a material selected from the group consisting of silicon nitride, silicon borate, alumina, diamond, and silicon oxide.

21. The material of claim 1, wherein R' is selected from the group consisting of a urethane group and a carboxyl group.

22. A no-flow underfill material comprising:
an epoxy resin represented by:

where R1 includes SiO$_2$;
R2 is a reactive or organic functional group selected from the group consisting of an isocynate group and a carbonyl chloride group;
R3 is an organic chain segment;
at least one agent acting as a cross-linking hardener and a curing catalyst capable of catalyzing the curing of the epoxy resin; and
a fluxing agent.

23. The no-flow underfill material of claim 22 further comprising:
an adhesion promoter;
a non-ionic surfactant;
fused silica;
silver flakes; and
thermally conductive particles.

24. The no-flow underfill material of claim 22 wherein the agent acting as a cross-linking hardener and a catalyst includes both a hardener and a catalyst.

25. The no-flow material of claim 22, wherein R' is selected from the group consisting of the urethane group and the carboxyl group.

26. A semiconductor package comprising:
a package substrate;
bond pads on the substrate;
a semiconductor die;
contact pads on the semiconductor die;
a respective conductive bump on each contact pad, the die being located so that each bump is in contact and attached to a respective bond pad; and
an underfill material filling regions between the bumps and including at least an epoxy-based resin represented by:

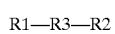

where R1 includes $SiO_2$;

R2 is a reactive organic functional group selected from the group consisting of an isocynate group and a carbonyl chloride group;

R3 is an or organic chain segment;

at least one agent acting as a cross-linking hardener and a curing catalyst capable of catalyzing the curing of the epoxy resin; and a fluxing agent.

27. The semiconductor package of claim 26, wherein R' is selected from the group consisting of the urethane group and the carboxyl group.

28. A semiconductor package comprising:

a package substrate;

bond pads on the substrate;

a semiconductor die;

contact pads on the semiconductor die;

a respective conductive bump on each contact pad, the die being located so that each bump is in contact and attached to a respective bond pad; and an underfill material filling regions between the bumps and including at least an epoxy-based resin represented by:

R1—R3—R2 where R1 includes $SiO_2$;

R2 is a reactive organic functional group selected from the group consisting of an isocynate group and a carbonyl chloride group;

R3 is an organic chain segment;

at least one agent acting as a cross-linking hardener and a curing catalyst capable of catalyzing the curing of the epoxy resin; and a fluxing agent.

* * * * *

UNITED STATES PATENT AND TRADEMARK OFFICE
CERTIFICATE OF CORRECTION

PATENT NO. : 6,794,761 B2
DATED : September 21, 2004
INVENTOR(S) : Shi et al.

It is certified that error appears in the above-identified patent and that said Letters Patent is hereby corrected as shown below:

Column 3,
Line 62, delete "triphenyiphospine" and insert -- triphenylphospine --.

Column 6,
Line 29, after "reactive", delete "or".

Signed and Sealed this

Fifteenth Day of February, 2005

JON W. DUDAS
*Director of the United States Patent and Trademark Office*